(12) United States Patent
Parikh et al.

(10) Patent No.: US 8,878,245 B2
(45) Date of Patent: Nov. 4, 2014

(54) TRANSISTORS AND METHOD FOR MAKING OHMIC CONTACT TO TRANSISTORS

(75) Inventors: Primit Parikh, Goleta, CA (US); Sten Heikman, Goleta, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/904,064

(22) Filed: Sep. 25, 2007

(65) Prior Publication Data
US 2008/0128753 A1    Jun. 5, 2008

Related U.S. Application Data

(60) Provisional application No. 60/872,308, filed on Nov. 30, 2006.

(51) Int. Cl.
| | |
|---|---|
| *H01L 29/66* | (2006.01) |
| *H01L 29/45* | (2006.01) |
| *H01L 29/778* | (2006.01) |
| *H01L 29/20* | (2006.01) |

(52) U.S. Cl.
CPC .......... *H01L 29/7787* (2013.01); *H01L 29/452* (2013.01); *H01L 29/66462* (2013.01); *H01L 29/2003* (2013.01)
USPC .... 257/194; 257/183; 257/192; 257/E21.046; 257/E21.09

(58) Field of Classification Search
CPC .. H01L 29/42316; H01L 29/45; H01L 29/452
USPC ............. 257/194, 192, 183, E21.046, E21.09
See application file for complete search history.

(56) References Cited

U.S. PATENT DOCUMENTS

| | | | |
|---|---|---|---|
| 4,824,767 A | 4/1989 | Chambers et al. | 430/314 |
| 5,192,987 A | 3/1993 | Khan | |
| 5,334,865 A * | 8/1994 | Fathimulla et al. | 257/192 |
| 5,393,990 A | 2/1995 | Kohn | |
| 5,500,381 A | 3/1996 | Yoshida et al. | 438/172 |
| 5,563,079 A | 10/1996 | Shin et al. | 438/571 |

(Continued)

FOREIGN PATENT DOCUMENTS

| | | |
|---|---|---|
| DE | 102007046743 | 4/2009 |
| EP | 1577951 A2 | 3/2005 |

(Continued)

OTHER PUBLICATIONS

Examination Report from related European Patent Application No. 02769655.8-1235, Dated: Nov. 3, 2008.

(Continued)

*Primary Examiner* — Julia Slutsker
(74) *Attorney, Agent, or Firm* — Koppel, Patrick, Heybl & Philpott (57) ABSTRACT

A transistor device having non-alloyed ohmic contacts formed by a process that improves the contact morphology and reduces metal spiking into the semiconductor layers. During fabrication, a regrowth mask is deposited on the semiconductor device. A portion of the regrowth mask and the epitaxial semiconductor layers is removed, defining areas for selective regrowth of a highly-doped semiconductor material. The remaining portion of the regrowth mask forms a regrowth mask residual layer. After regrowth, ohmic contacts are formed on the regrowth structures without the use of a high-temperature annealing process. The regrowth mask residual layer does not need to be removed, but rather remains on the device throughout fabrication and can function as a passivation layer and/or a spacer layer.

37 Claims, 3 Drawing Sheets

(56) References Cited

U.S. PATENT DOCUMENTS

| | | | | |
|---|---|---|---|---|
| 5,712,175 | A | 1/1998 | Yoshida | 438/167 |
| 5,990,531 | A * | 11/1999 | Taskar et al. | 257/410 |
| 6,004,881 | A | 12/1999 | Bozada et al. | |
| 6,046,464 | A | 4/2000 | Schetzina | 257/96 |
| 6,071,780 | A | 6/2000 | Okamoto | 438/287 |
| 6,177,685 | B1 | 1/2001 | Teraguchi et al. | |
| 6,197,609 | B1 | 3/2001 | Tsutsui et al. | |
| 6,316,820 | B1 | 11/2001 | Schmitz et al. | 257/649 |
| 6,586,813 | B2 * | 7/2003 | Nagahara | 257/472 |
| 6,869,812 | B1 | 3/2005 | Liu | |
| 6,885,036 | B2 | 4/2005 | Tarsa et al. | 257/99 |
| 6,888,171 | B2 | 5/2005 | Liu et al. | 257/99 |
| 7,141,825 | B2 | 11/2006 | Horio et al. | 257/79 |
| 7,365,374 | B2 * | 4/2008 | Piner et al. | 257/189 |
| 7,432,142 | B2 * | 10/2008 | Saxler et al. | 438/167 |
| 7,439,166 | B1 | 10/2008 | Milosavljevic et al. | 438/577 |
| 7,608,497 | B1 | 10/2009 | Milosavljevic et al. | 438/182 |
| 8,368,100 | B2 | 2/2013 | Donofrio et al. | 257/98 |
| 2002/0017648 | A1 * | 2/2002 | Kasahara et al. | 257/79 |
| 2003/0085409 | A1 | 5/2003 | Shen et al. | |
| 2003/0218183 | A1 * | 11/2003 | Micovic et al. | 257/192 |
| 2004/0159865 | A1 | 8/2004 | Allen et al. | |
| 2005/0173728 | A1 | 8/2005 | Saxler | |
| 2005/0211989 | A1 | 9/2005 | Horio et al. | 257/79 |
| 2005/0258431 | A1 * | 11/2005 | Smith et al. | 257/79 |
| 2005/0258450 | A1 * | 11/2005 | Saxler | 257/192 |
| 2005/0258451 | A1 * | 11/2005 | Saxler et al. | 257/192 |
| 2006/0006414 | A1 * | 1/2006 | Germain et al. | 257/192 |
| 2006/0108606 | A1 * | 5/2006 | Saxler et al. | 257/200 |
| 2006/0202272 | A1 * | 9/2006 | Wu et al. | 257/355 |
| 2006/0273335 | A1 | 12/2006 | Asahara | |
| 2007/0063215 | A1 | 3/2007 | Kohda | |
| 2007/0102715 | A1 | 5/2007 | Ko et al. | |
| 2007/0228415 | A1 | 10/2007 | Kanamura et al. | |
| 2008/0064133 | A1 | 3/2008 | Lee et al. | 257/29 |
| 2008/0203541 | A1 | 8/2008 | Makiyama | 257/640 |
| 2008/0217635 | A1 | 9/2008 | Emerson et al. | |
| 2008/0230799 | A1 | 9/2008 | Wang et al. | |
| 2008/0237640 | A1 | 10/2008 | Mishra et al. | |
| 2008/0241757 | A1 | 10/2008 | Xu et al. | |
| 2008/0258270 | A1 * | 10/2008 | Bondoux et al. | 257/632 |
| 2008/0290364 | A1 | 11/2008 | Kamiya et al. | |
| 2008/0308832 | A1 | 12/2008 | Hsieh et al. | |
| 2009/0140272 | A1 | 6/2009 | Beeson et al. | |
| 2009/0283787 | A1 | 11/2009 | Donofrio et al. | |

FOREIGN PATENT DOCUMENTS

| | | |
|---|---|---|
| EP | 1 901 341 | 3/2008 |
| EP | 1 901 342 | 3/2008 |
| JP | 57042179 | 3/1982 |
| JP | 4284620 | 10/1992 |
| JP | 07-283140 | 10/1995 |
| JP | 07111544 | 4/1996 |
| JP | 08111544 | 4/1996 |
| JP | 08111544 A | 4/1996 |
| JP | 09008403 | 1/1997 |
| JP | 9129532 | 5/1997 |
| JP | 10189649 | 7/1998 |
| JP | 10-223901 | 8/1998 |
| JP | 11150298 | 6/1999 |
| JP | 11-261052 | 9/1999 |
| JP | 2000-174260 | 6/2000 |
| JP | 2000311704 | 7/2000 |
| JP | 2001-007325 | 1/2001 |
| JP | 2001-077415 | 3/2001 |
| JP | 2001-098369 | 4/2001 |
| JP | 2001-308380 | 11/2001 |
| JP | 2002-77353 | 3/2002 |
| JP | 2002353499 | 12/2002 |
| JP | 2003347589 | 12/2003 |
| JP | 2004047988 | 2/2004 |
| JP | 2004-266240 | 9/2004 |
| JP | 2005244152 | 9/2005 |
| JP | 2005123489 | 12/2005 |
| JP | 2006128727 | 5/2006 |
| JP | 2006313888 | 11/2006 |
| JP | 2007073965 | 3/2007 |
| JP | 200731704 | 11/2007 |
| JP | 2008112957 | 5/2008 |
| JP | 2008288548 | 11/2008 |
| JP | 2009049342 | 3/2009 |
| TW | 564584 | 12/2003 |
| TW | 200627674 | 8/2006 |
| TW | 200627675 | 8/2006 |
| WO | WO00/04587 | 1/2000 |
| WO | WO 2005/114743 A | 12/2005 |
| WO | WO2005114743 A2 | 12/2005 |
| WO | WO2006006555 | 1/2006 |
| WO | WO 2007/141763 A1 | 12/2007 |
| WO | WO2007141763 | 12/2007 |
| WO | WO 2009/039805 A1 | 4/2009 |

OTHER PUBLICATIONS

Second Office Action from related China Application No. 02818502. 1., Dated: Feb. 19, 2009.

Examination Report from related European Patent Application No. 06851411.6-2203, dated: Jan. 26, 2009.

"Enhancement of Base Conductivity Via the Piezoelectric Effect in AlGaN/GaN HBTs", Asbeck et al., Aug. 18, 1999, Solid State Electronics 44 (2000) 211 219, pp. 211-219.

"New UV Light Emitter based on AlGaN Heterostructures with Graded Electron and Hole Injectors", Johnson et al., XP-002505432, Mat. Res. Soc. Symp. Proc. vol. 743, 2003, Materials Research Society, pp. 1.2.4.1-1.7.4.6.

"Polarization-Induced 3-Dimensional Electron Slabs in Graded AlGaN Layers", Simon et al., XP-002505433, Mater. Res. Soc. Symp. Proc. vol. 892, 2006 Materials Research Society,pp. 1-6.

Examiner's Report from related Canada Patent Application No. 2,399,547, Dated: Mar. 4, 2009.

(From related application) European Office Action, Patent Application No. 07253716.0 dated Jan. 26, 2010.

Okamoto Y. et al. "A 149W Recessed-Gate AlGaN/GaN FP-FET", Microwave Symposium Digest, vol. 3, Jun. 6, 2004, p. 1351-1354.

From related application: European Office Action, Patent Application No. 02792174.1 dated Mar. 8, 2010.

From related application: European Office Action, Patent Application No. 02769655.8 dated Mar. 3, 2010.

Office Action Dated Dec. 28, 2009 for Related U.S. Appl. No. 11/726,975.

Examination Report re European Application No. 02 792 174.1-1235, Dated Oct. 7, 2008.

Related Extended European Search Report re European Application No. 08250197.4-1235/1973163, Dated: Nov. 6, 0.

Xing, "High Breakdown Voltage AlGaN-GaN HEMTs Achieved by Multiple Field Plates", IEEE Electron Device Letters,vol. 25, No. 4, Apr. 2004, pp. 161-163.

Result of Examination for related Korean Application No. 10-2004-7001027, Dec. 15, 2009.

IEEE Electron Device Letters, vol. 21, No. 2, Feb. 2000, pp. 63-65, "AlGaN/GaN Metal Oxide Semiconductor Heteroatructure Field Effect Transistor,", M. Asif Khan et al.

Japanese Publication No. Hei 11-224881, Aug. 17, 1999, Compound Semiconductor Apparatus.

IEEE Electron Device Letters, vol. 21, No. 9, Sep. 2000, pp. 421-423, "High Breakdown GaN HEMT with Overlapping Gate Structure," N.-Q. Zhang et al.

Wu et al. , "Bias-Dependent Performance of High-Power AlGaN/GaN HEMTs", IEDM-2001, Washington DC, Dec. 2-6 2001,pp. 378-380.

Wu Lu, "AlGaN/GaN HEMTs on SiC With Over 100 GHz fT and Low Microwave Noise", IEEE Transactions on Electron Devices, vol. 48, No. 3, Mar. 2001, pp. 581-585.

Wu, "30-W/mm GaN HEMTs by Field Plate Optimization", IEEE Electron Device Letters, vol. 25, No. 3, Mar. 2001, pp. 117-119.

(56) References Cited

OTHER PUBLICATIONS

Karmalkar et al. "Very High Voltage AlGaN/GaN High Electron Mobility Transistors Using a Field Plate Deposited on a Stepped Insulator", Solid State Electronics 45 (2001) pp. 1645-1652.
Wu et al."High Al-Content AlGaN/GaN HEMTs on SiC Substrates With Very-High Power Performance", IEEE 1999 Digest, pp. 925-927.
Gaska, "High-Temperature Performance of AlGaN/GaN HFEts on SiC Substrates", IEEE Electron Device Letters, vol. 18, No. 10, Oct. 1997, pp. 492-494.
Gaska et al., "Electron Transport in AlGaN-GaN Heterostructures Grown on 6H-SiC Substrates", Applied Physics Letters, vol. 72, No. 6, Feb. 1998, pp. 707-709.
Gelmont et al., "Monte Carlo Simulation of Electron Transport in Gallium Nitride", J. Applied Physics, vol. 74, No. 3, Aug. 1993, pp. 1818-1821.
First Examination Report from related European Patent Application No. 08250197.4, dated: Jul. 28, 2009.
Official Rejection of Japanese Patent Application No. 2003-535260, dated: Jun. 19, 2009.
Patent Abstracts of Japan, Pub. 10-223901, Pub. Date: Aug. 21, 1998.
Khan et al., "AlGaN/GaN Metal-Oxide-Semiconductor Heterostructure Field-Effect Transistors on SiC Substrates", Applied Physics Letters Vo. 77, No. 9, Aug. 2000, pp. 1339-1341.
Extended European Search Report, for related European Application No. 07253716.0, Dated: Jun. 25, 2009.
Examination Report re related European Application No. 01 905 364.4, dated: Jun. 24, 2009.
Office Action for family related U.S. Appl. No. 11/799,786, dated Sep. 8, 2008.
Office Action for family related U.S. Appl. No. 11/356,791, dated: Sep. 2, 2008.
Related European Examination Report for European Patent Application No. 02769655.8, dated: Dec. 8, 2008.
Related Office Action from Japanese Patent Office re Japanese Patent Application No. 2002-590421, dated: Oct. 21, 2008.
Japanese Patent Application Public Disclosure 2000-68498, Date: Mar. 3, 2000.
Japanese Patent Application Public Disclosure 2001-77353, dated Mar. 23, 2001.
Final Notice of Reasons for Rejection (Summary) for Japanese Patent Application No. 2003-535260 dated Nov. 2, 2010.
Final Notice of Reasons for Rejection (Summary) for Japanese Patent Application No. 2009-243336 dated Nov. 2, 2010.
Decision of Rejection (Summary) for counterpart Japanese Patent Application No. 2009-243337 dated Nov. 2, 2010.
Extended Search Report for European Patent Application No. 10187940.1 dated Feb. 8, 2011.
Lu, W., et al., "P-Type SiGe Transistors with Low Gate Leakage Using SiN Gate Dielectric", IEEE Electron Device Letters, IEEE Inc., New York, US vol. 20, No. 10, Oct. 1999, pp. 514-516 (XP000890470).
Zhang, N-Q, et al., "High Breakdown GaN HEMT with Overlapping Gate Structure", IEEE Electronc Device Letters, IEEE, Inc., New York, US, vol. 21, No. 9, Sep. 2000, pp. 373-375, XP000954354.
International Tilak, V., et al., "Effect of Passivation on AlGaN/GaN HEMT Device Performance", 2000IEEE International Symposium on Compound Semiconductors, Proceedings of the IEEE Twenty-Seventh Symposium on Compound Semiconductors (Cat. No. 00TH8498), 2000 IEEE International Symposium on Compound Semiconductors Proceedings of TH, 2000, p. 357-363, XP002239700, Piscataway, NJ, USA, IEEE, USA.
Final Official Notice of Rejection from Japanese Patent Application No. 2003-535260 mailed Jun. 8, 2010.
Official Notice of Rejection from Japanese Patent Application No. 2009-243336 mailed Jun. 8, 2010.
Official Notice of Rejection from Japanese Patent Application No. 2009-243337 mailed Jun. 8, 2010.
Response to Office Action from U.S. Appl. No. 11/726,975, dated: Mar. 29, 2010.
Office Action from U.S. Appl. No. 11/356,791, dated: Apr. 7, 2010.
Response to Office Action from U.S. Appl. No. 11/356,791, dated May 25, 2010.
Office Action from U.S. Appl. No. 11/356,791, dated: Jun. 11, 2010.
Examiner's Report from Canadian Patent Application No. 2,447,058 dated Dec. 15, 2009.
Invitation to Submit Applicant's Opinion and Examiner's Report to the Board, in Japanese Patent Application No. 2002-590421, Appeal Filing No. 2009-000996 dated Oct. 12, 2010.
Office Action from U.S. Appl. No. 12/432,478, dated: Nov. 17, 2010.
Response to Office Action from U.S. Appl. No. 12/432,478, filed: Mar. 17, 2011.
Office Action from U.S. Appl. No. 12/432,478, dated: May 16, 2011.
Office Action from U.S. Appl. No. 12/012,376, dated: Jul. 8, 2010.
Response to Office Action from U.S. Appl. No. 12/012,376, filed: Sep. 28, 2010.
Office Action from U.S. Appl. No. 12/012,376, dated: Dec. 3, 2010.
Response to Office Action from U.S. Appl. No. 12/012,376, filed: Jan. 26, 2011.
Office Action from U.S. Appl. No. 12/012,376, dated: Feb. 22, 2011.
Response to Office Action from U.S. Appl. No. 12/012,376, filed: Mar. 22, 2011.
Office Action from U.S. Appl. No. 12/185,031, dated: Jun. 14, 2011.
Grundbacher et al., "Utilization of an Electron Beam Resist Process to Examine the Effects of Asymmetric Gate Recess on the Device Characteristics of AlGaAs/InGaAs PHEMT's." IEEE. vol. 44, No. 12, Dec. 1997.
Notice of Allowance from U.S. Appl. No. 12/012,376, dated: May 13, 2011.
International Search Report and Written Opinion for PCT/US2010/024980 mailed Oct. 6, 2010.
Notice of Reasons for Rejection, Japanese Patent Appl. No. 2009-132243, dated Dec. 16, 2011.
Decision of Rejection from Japanese Patent Application No. 2009-132243, dated Oct. 2, 2012.
Interrogation from Japanese Patent Application No. 2009-132243, dated Apr. 23, 2013.
Notice of Reasons for Rejection from Japanese Patent Application No. 2012-510802, dated May 21, 2013.
Rejection Decision from Chinese Patent Appl. No. 200880020777.7, dated Jul. 3, 2013.
Interrogatory from Japanese Patent Appl. No. 2010-504160, dated Jul. 16, 2013.
Preliminary Examination Report from Japanese Patent Appl. No. 2010-504160, dated Jun. 25, 2013.
First Office Action from Chinese Patent Appl. No. 201080026730.9, dated Oct. 23, 2013.
Notice of Reasons for Rejection from Japanese Patent Appl. No. 2009-132243, dated Oct. 1, 2013.
Office Action from Japanese Patent Appl. No. 2012-510802, dated Oct. 8, 2013.
Office Action from U.S. Appl. No. 12/432,478, dated Jun. 20, 2012.
Response to OA from U.S. Appl. No. 12/432,478, filed Aug. 17, 2012.
Office Action from U.S. Appl. No. 12/185,031, dated Jun. 12, 2012.
Response to OA from U.S. Appl. No. 12/185,031, filed Aug. 24, 2012.
Office Action from U.S. Appl. No. 13/023,788, dated Mar. 12, 2013.
Response to OA from U.S. Appl. No. 13/023,788, filed Jun. 11, 2013.
Office Action from U.S. Appl. No. 11/738,171, dated Jun. 27, 2013.
Office Action from U.S. Appl. No. 12/432,478, dated Jul. 1, 2013.
Office Action from U.S. Appl. No. 13/023,788, dated Jul. 2, 2013.
Decision of Dismissal of Amendment from Japanese Patent Appl. No. 2012-510802, dated Feb. 18, 2014.
Second Office Action from Chinese Patent Appl. No. 201080026730.9 dated Apr. 9, 2014.
PCT Notification of Transmittal of International Preliminary Examination Report for related PCT Application No. PCT/US06/26405, dated: Jan. 20, 2010.
Office Action from Taiwanese Patent Appl. No. 097114378, dated May 12, 2014.

* cited by examiner

TRANSISTORS AND METHOD FOR MAKING OHMIC CONTACT TO TRANSISTORS

This application claims the benefit of a provisional application (App. No. 60/872,308) which was filed on Nov. 11, 2006.

This invention was made with Government support under Contract No. 05-C-0226 awarded by the Office of Naval Research. The Government has certain rights in this invention.

BACKGROUND OF THE INVENTION

1. Field of the Invention

This invention relates to transistors and more particularly to transistors and methods for making ohmic contact to a transistor incorporating selective area growth.

2. Description of the Related Art

Improvements in the manufacturing of AlGaN/GaN semiconductor materials have helped advance the development of AlGaN/GaN transistors, such as high electron mobility transistors (HEMTs) for high frequency, high temperature and high power applications. AlGaN/GaN has large bandgaps, high peak and saturation electron velocity values [B. Gelmont, K. Kim and M. Shur, *Monte Carlo Simulation of Electron Transport in Gallium Nitride*, J. Appl. Phys. 74, (1993), pp. 1818-1821]. AlGaN/GaN HEMTs can also have 2DEG sheet densities in excess of $10^{13}$ cm-2 and relatively high electron mobility (up to 2019 cm$^2$/Vs) [R. Gaska, et al., *Electron Transport in AlGaN—GaN Heterostructures Grown on 6H—SiC Substrates,* Appl. Phys. Lett. 72, (1998), pp. 707-709]. These characteristics allow AlGaN/GaN HEMTs to provide very high voltage and high power operation at RF, microwave and millimeter wave frequencies.

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., *High-Temperature Performance of AlGaN/GaN HFET's on SiC Substrates*, IEEE Electron Device Letters, 18, (1997), pp. 492-494; and Wu et al. "High Al-content AlGaN/GaN HEMTs With Very High Performance", IEDM-1999 Digest, pp. 925-927, Washington D.C., December 1999. Some of these devices have shown a gain-bandwidth product (fT) as high as 100 gigahertz (Lu et al. "AlGaN/GaN HEMTs on SiC With Over 100 GHz ft and Low Microwave Noise", IEEE Transactions on Electron Devices, Vol. 48, No. 3, March 2001, pp. 581-585) and high power densities up to 10 W/mm at X-band (Wu et al., "Bias-dependent Performance of High-Power AlGaN/GaN HEMTs", IEDM-2001, Washington D.C., Dec. 2-6, 2001).

Field plates have been used to enhance the performance of GaN-based HEMTs [See S Kamalkar and U. K. Mishra, *Very High Voltage AlGaN/GaN High Electron Mobility Transistors Using a Field Plate Deposited on a Stepped Insulator*, Solid State Electronics 45, (2001), pp. 1645-1662]. Recently, field plate optimization for operation at microwave frequencies has resulted in drastically improved power densities exceeding 30 W/mm at 4 and 8 GHz [Wu et al, 30 W/mm GaN HEMTs by field plate optimization, IEEE Electron Device Letters, Vol. 25, No. 3, March 2004]. However, the reliability of these devices is still an issue, especially at high operation temperatures.

In present technology, ohmic contacts to GaN HEMTs are typically formed by alloying metal contacts at high temperature. This process results in ohmic contacts with rough morphology, which is undesirable for reliable devices and robust manufacturing. Furthermore, it has been proposed that alloying causes metal spiking into the semiconductor reducing the breakdown voltage of the device.

A typical prior art process for forming ohmic contacts on GaN HEMTs consists of depositing Ti/Al/Ni/Au or other similar metals on the semiconductor surface and then alloying the metals at a high temperature (>800° C.). This process results in ohmic contacts with rough morphology and a reduction in device breakdown voltage due to the spiking of the ohmic metal into the semiconductor.

Some technologies for non-annealed or low-temperature annealed ohmic contacts exist. These technologies include Si implants under the ohmic contacts, n$^+$ GaN caps on top of the AlGaN/GaN structure, and selective area growth of n$^+$ GaN in the contact region. These technologies, however, add complications to the process. In some of these prior art processes the regrowth mask is removed after the regrowth is performed. The mask removal can be difficult, leaving mask residue on the semiconductor surface. This problem can be exacerbated by a change in density or recrystallization of the regrowth mask during the high temperature regrowth stage.

SUMMARY OF THE INVENTION

One embodiment of a transistor device according to the present invention comprises at least one semiconductor layer. A regrowth mask residual layer is disposed on the at least one semiconductor layer. The regrowth mask residual layer has a gate trench. The device also includes a plurality of regrowth structures, each comprising a highly-doped semiconductor material. The regrowth structures contact respective portions of the at least one semiconductor layer. A drain contact and a source contact are each disposed on a different one of the regrowth structures. A gate is disposed on the regrowth mask residual layer and contacts the barrier layer through the gate trench.

One embodiment of a gallium nitride high electron mobility transistor (GaN HEMT) device according to the present invention comprises a plurality of semiconductor layers. A regrowth mask residual layer covers at least a portion of the plurality of semiconductor layers. A gate is disposed on the regrowth mask residual layer and contacts the plurality of semiconductor layers through a gate trench in the regrowth mask residual layer. A plurality of regrowth structures is disposed on the plurality of semiconductor layers. A source contact is disposed such that one of the regrowth structures is interposed between the source contact and the plurality of semiconductor layers. A drain contact is disposed such that one of the regrowth structures is interposed between the drain contact and the plurality of semiconductor layers.

An embodiment of a method for manufacturing a transistor device comprises growing a plurality of semiconductor layers on a substrate. A regrowth mask is formed on the plurality of semiconductor layers. Selected areas of the regrowth mask are removed such that portions of the plurality of semiconductor layers beneath the regrowth mask are also removed, leaving a regrowth mask residual layer to remain. Highly doped n-type regions are grown in the selected areas where the regrowth mask has been removed. Contact metals are deposited on the highly doped n-type regions. Material is removed from said regrowth mask residual layer to define a gate trench. Then, a gate is deposited on the regrowth mask residual layer and in the gate trench such that the gate contacts the plurality of semiconductor layers.

DETAILED DESCRIPTION OF THE INVENTION

The present invention as disclosed in the claims enables low contact resistance as well as good morphology in the ohmic contacts without the use of high temperature annealing processes. This results in an ohmic contact fabrication process that does not require high temperature annealing or any annealing at all of the ohmic contact metals. One embodiment of a device according to the present invention relies on selective area growth wherein the regrowth mask material is chosen, and is deposited, in such a way that it can serve as a passivation and/or spacer element on the semiconductor surface in the final device structure. Thus, after the regrowth is performed, the regrowth mask is not removed, but stays on the semiconductor surface during the remainder of the device fabrication.

Embodiments of the invention are generally directed to transistors and in particular Group-III nitride HEMT devices, in which the ohmic contacts are non-alloyed. Although embodiments of the present invention are applicable to many different devices, they are particularly applicable to microwave and millimeter power GaN transistors and high-voltage switching GaN transistors.

The present invention is described herein with reference to certain embodiments, but it is understood that the invention can be embodied in many different forms and should not be construed as limited to the embodiments set forth herein.

It is also understood that when an element such as a layer, region or substrate is referred to as being "on" another element, it can be directly on the other element or intervening elements may also be present. Furthermore, relative terms such as. "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. It is understood that many of the layers will have different relative thicknesses compared to those shown. Further, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 1A:
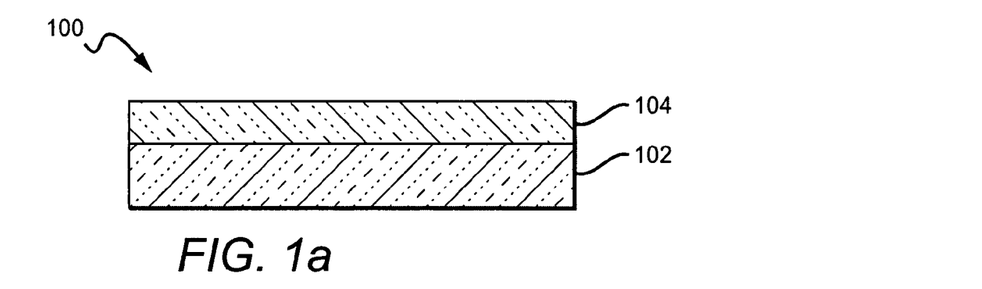
FIGS. 1a-1h show a cross-sectional view of a transistor device according to an embodiment of the present invention at different stages of the fabrication process.

FIGS. 1a-1h show an embodiment of a transistor device 100 in various stages of the fabrication process. In FIG. 1a, a substrate 102 such as sapphire or silicon carbide (SiC), for example, is provided on which one or more epitaxial layers 104 are grown. Some embodiments of the invention may be particularly well-suited for use in nitride-based devices such as Group III-nitride based HEMTs. As used herein, the term "Group III-nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN, InGaN, and AlInGaN. As well understood by those in this art, the Group III elements can combine with nitrogen to form binary (e.g., GaN), ternary (e.g., AlGaN and AlInN), and quaternary (e.g., AlInGaN) compounds. Although many material systems may be used, in a preferred embodiment the transistor device 100 is a gallium nitride high electron mobility transistor (GaN HEMT).

Figure 1B:
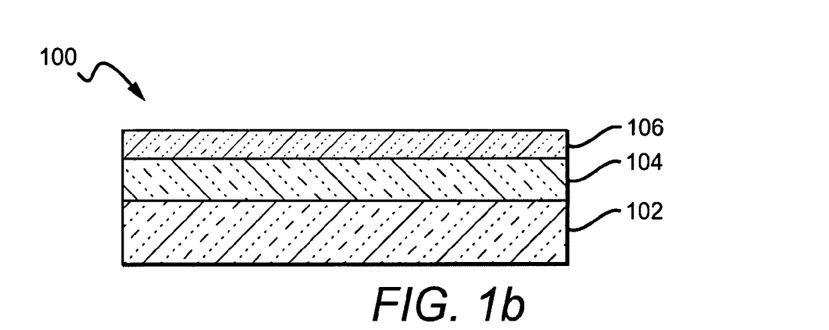

The device 100 may comprise a barrier layer 106 that is disposed on the epitaxial layers 104 as shown in FIG. 1b. The barrier layer 106 can be doped or undoped layers of Group III-nitride materials. Barrier layers are known in the art and may be grown on or as a part of the epitaxial structure. In a preferred embodiment, the barrier layer 106 may be AlGaN or, in other embodiments, the barrier layer 106 may include multiple layers, such as an AlN layer and an AlGaN layer.

Figure 1C:
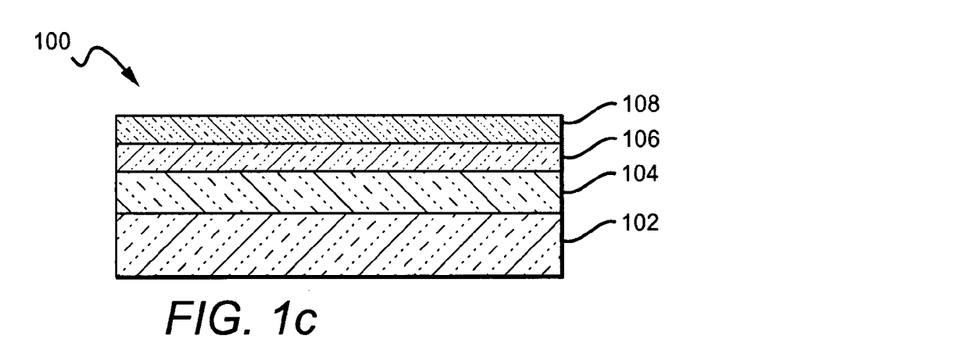

In this embodiment, a regrowth mask 108 is disposed on the barrier layer 106 as shown in FIG. 1c. The regrowth mask material is chosen and is deposited and selectively removed in such a way that it can function as a passivation layer on the semiconductor surface of the device 100. Silicon nitride (SiN) may be used as the regrowth mask material. Initially, the regrowth mask 108 is deposited on the surface of the epitaxial structure, in this embodiment, the barrier layer 106. The regrowth mask 108 can be deposited either in-situ after the growth of the layers 104, 106 in an MOCVD reactor, or it can be deposited ex-situ in a high-temperature CVD system as long as the mask is of sufficient quality.

Figure 1D:
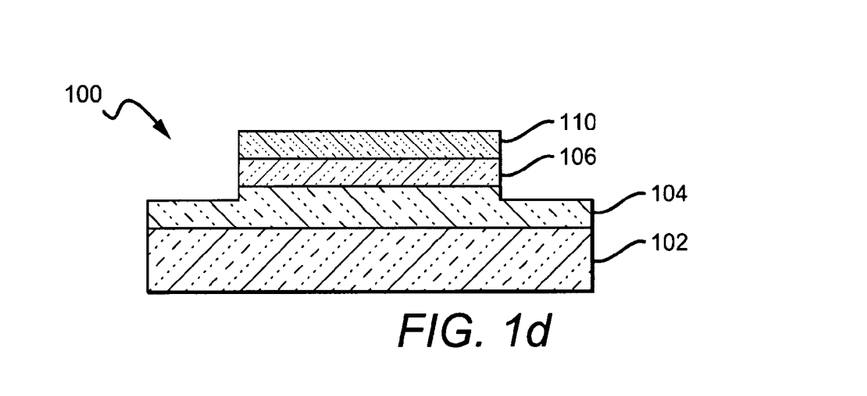

After deposition, the device 100 can be patterned using a photoresist. Referring to FIG. 1d, portions of the regrowth mask 108, and optionally portions of the barrier layer 106 and the epitaxial layers 104 are then removed by etching, for example. Other methods of removal may also be used. The materials may be removed to various depths within the barrier layer 106 and the epitaxial layers 104, with an acceptable depth being approximately 5 nm-1000 nm past the surface of the top semiconductor layer, in this case the barrier layer 106. The removed portions define regrowth areas. The portion of the regrowth mask that is left constitutes a regrowth mask residual layer 110 that remains on the device 100 during subsequent fabrication processes.

Figure 1E:
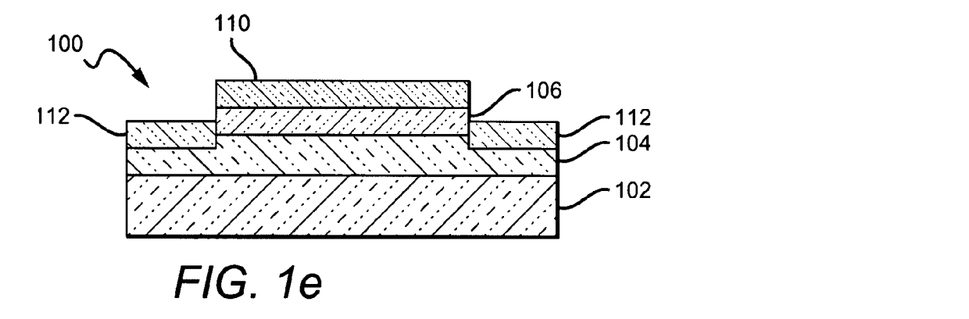

Highly-doped semiconductor materials are then grown in the regrowth areas, forming regrowth structures 112 that contact the epitaxial layers 104 and/or the barrier layer 106 as shown in FIG. 1e. The highly-doped semiconductor materials only deposit in those areas not covered by the regrowth mask residual layer 110. In a GaN HEMT device, the highly-doped semiconductor material can be $n^+$ GaN. The regrowth structures 112 may also comprise other materials as discussed below. An acceptable thickness for the regrowth structures 112 is approximately 5 nm-500 nm. The local deposited thickness of the regrowth structures 112 may be thicker in certain areas, especially near the edge of the regrowth mask residual layer 110. Again, it is noted that the figures are not drawn to scale and thus, do not reflect the accurate spatial relationship of the elements to scale; however, the general relationship is conveyed.

Figure 1F:
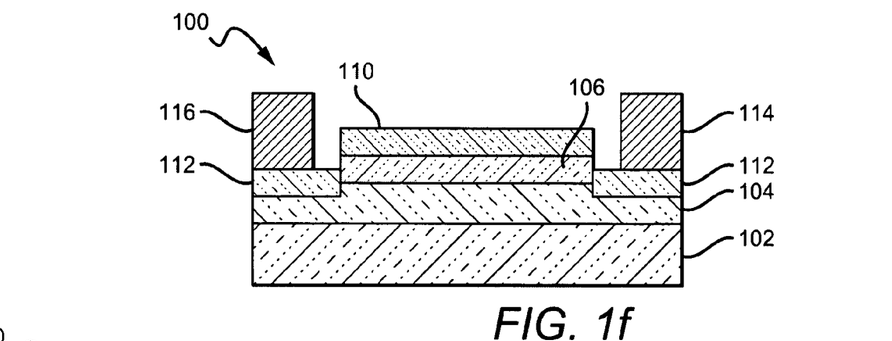

Referring to FIG. 1*f*, a contact metal is deposited on the regrowth structures 112, forming a drain contact 114 and a source contact 116. The high doping density of the regrowth structures 112 ensures that a low contact resistance can be achieved without annealing the contacts 114, 116 at high temperatures.

Figure 1G:
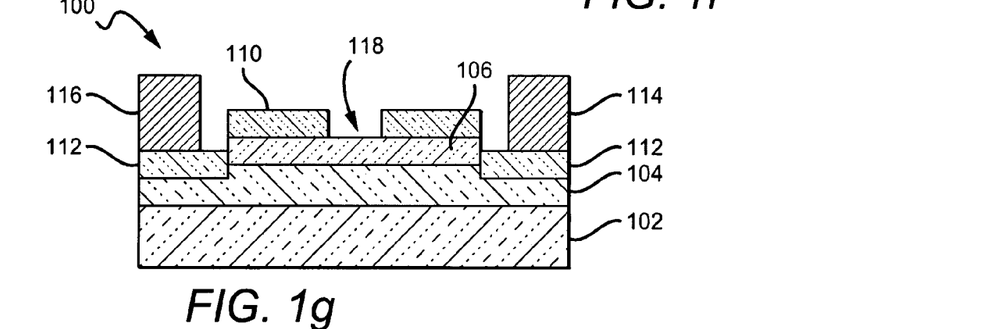
Figure 1H:
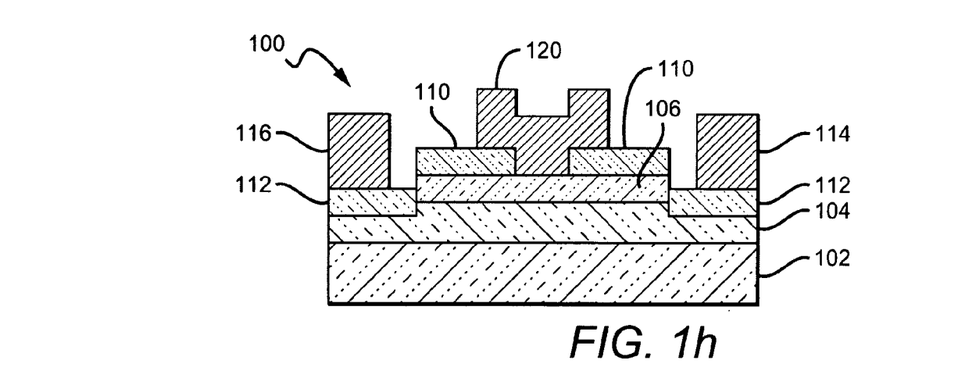

In FIGS. 1*g* and 1*h*, some material is removed from the regrowth mask residual layer 110 to define a gate trench 118. The material may be removed by etching, for example. A gate contact 120 is then deposited in the gate trench 118 and on surrounding portions of regrowth mask residual layer 110. It may also be desirable to deposit the drain, source and gate contacts 114, 116, 120 in a single step, thereby eliminating one of the lithography/deposition steps in the process if either low-temperature annealing or no annealing of the ohmic contact is done.

Figure 2:
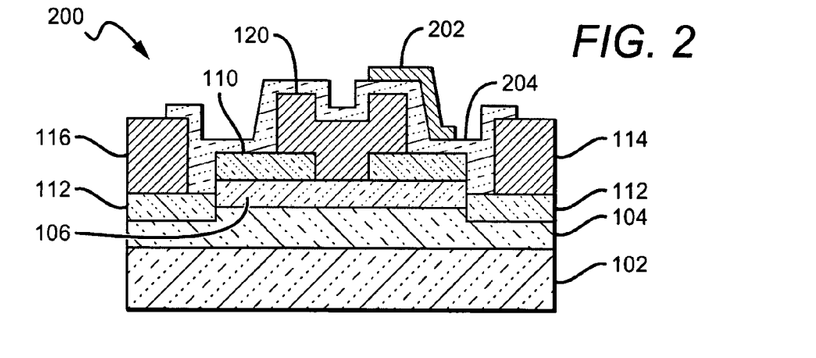
FIG. 2 shows a cross-sectional view of a transistor device according to an embodiment of the present invention.

FIG. 2 shows another embodiment of a transistor device 200. The device 200 is similar to the device 100 and has several elements in common as indicated by common reference numbers. The device 200 features a field plate 202. The field plate 202 can help to reduce the electric field within the device 200. This helps to diminish component degradation due to spatially confined spikes in the electric field within the device 200. The field plate 202 is disposed on a spacer layer 204. The spacer layer 204 is deposited such that it at least partially covers the gate 120 and the regrowth mask residual layer 110 between the drain and source contacts 114, 116. The spacer layer 204 can comprise a dielectric or another non-conductive material. As shown, the spacer layer may cover a portion of the drain and source contacts 114, 116.

In this particular embodiment, the field plate 202 at least partially overlaps the gate contact 120 and extends toward the drain contact 114. It is understood, however, that many different field plate shapes and configurations may be used. For example, a field plate may be connected to the source through an internal or external conductive path. It is also possible to include additional field plates separated by additional spacer layers.

Figure 3:
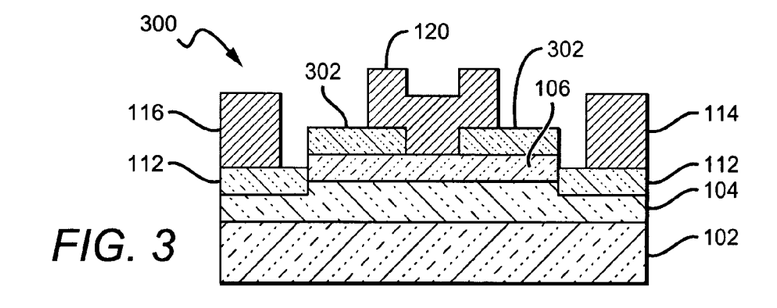
FIG. 3 shows a cross-sectional view of a transistor device according to an embodiment of the present invention.

FIG. 3 illustrates another embodiment of a transistor device 300. The device 300 is similar to the device 100 and comprises several common elements as indicated by common reference numbers. The device 300 features regrowth mask residual layer 302 formed from aluminum nitride (AlN). The AlN material is deposited at a high temperature, either in-situ after the growth of the epitaxial layer in an MOCVD reactor or ex-situ in a high temperature CVD system. Similarly as described above, the AlN material is selectively removed by etching, for example. The portion of the AlN material that remains forms the regrowth mask residual layer 302 which functions to passivate the surface of the device and isolate various elements within the device 300. The device can include an additional spacer layer and field plates (not shown).

Figure 4:
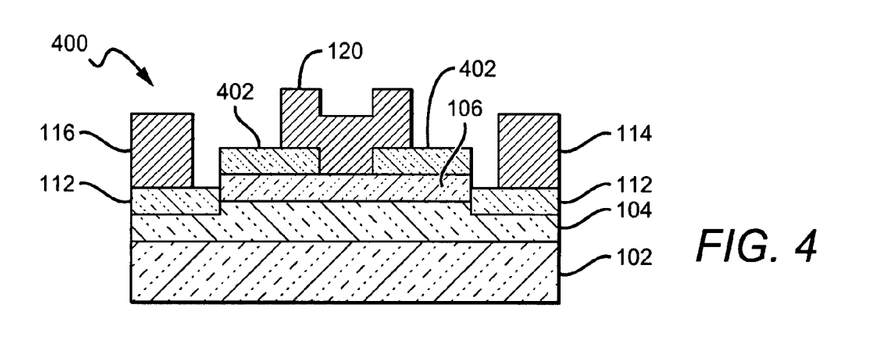
FIG. 4 shows a cross-sectional view of a transistor device according to an embodiment of the present invention.

FIG. 4 shows another embodiment of a transistor device 400. The device 400 is similar to the device 100 and shares several common elements. In this particular embodiment, the regrowth mask residual layer 402 is formed from any non-conducting material that exhibits minimal degradation during the subsequent regrowth process. Furthermore, the regrowth structure material should not deposit on the regrowth mask during the process. The regrowth mask residual layer 402 can be a dielectric material or an insulator, for example, and functions as a passivation layer and/or a spacer in the finished device 400.

Figure 5:
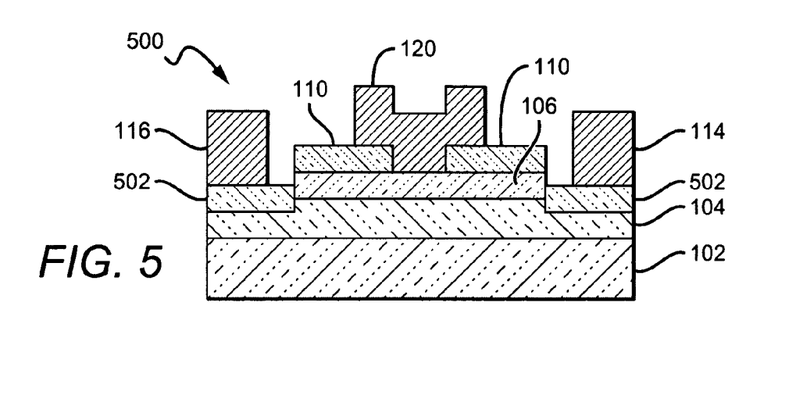
FIG. 5 shows a cross-sectional view of a transistor device according to an embodiment of the present invention.

FIG. 5 shows an embodiment of a transistor device 500. The device 500 is similar to the device 100 and contains several common elements. The device 500 features regrowth structures 502 that comprise heavily-doped aluminum gallium nitride ($n^+$ AlGaN), heavily-doped indium gallium nitride ($n^+$ InGaN), or a combination such as $n^+$ AlGaN/GaN or $n^+$ InGaN/GaN. The regrowth structures 502 provide a low contact resistance that does not require annealing the contacts 114, 116 at high temperatures.

Although the present invention has been described in considerable detail with reference to certain embodiments thereof, other versions are possible. The various embodiments of the transistor device can include additional elements such as field plates, for example, as described above. The field plates and gates can also have many different shapes and may be connected to the source contact in many different ways. Accordingly, the spirit and scope of the invention should not be limited to the embodiments of the invention described above.

We claim:

1. A transistor device, comprising:
at least one semiconductor layer;
a regrowth mask residual layer on at least a portion of said at least one semiconductor layer, said regrowth mask residual layer comprising a gate trench;
a plurality of regrowth structures comprising a highly doped semiconductor material, said regrowth structures on different portions of said at least one semiconductor layer than the portion covered by said regrowth mask residual layer, wherein a top surface of each of said regrowth structures is below a top surface of said at least one semiconductor layer, said regrowth structures on respective portions of said at least one semiconductor layer;
a drain contact and a source contact, each disposed on a different one of said regrowth structures;
a gate disposed on said regrowth mask residual layer and electrically coupled to said at least one semiconductor layer through said gate trench.

2. The transistor device of claim 1, wherein said regrowth mask residual layer functions as a passivation layer.

3. The transistor device of claim 1, wherein said at least one semiconductor layer comprises gallium nitride (GaN).

4. The transistor device of claim 1, wherein said plurality of regrowth structures comprises highly doped gallium nitride ($n^+$ GaN.)

5. The transistor device of claim 1, wherein said transistor device comprises a high electron mobility transistor (HEMT).

6. The transistor device of claim 1, wherein said regrowth structures contact said source and drain contacts such that an ohmic contact having a non-annealed morphology or a morphology consistent with low-temperature annealing is formed.

7. The transistor device of claim 1, wherein said at least one semiconductor layer comprises a barrier layer below said regrowth mask residual layer.

8. The transistor device of claim 1, further comprising a spacer layer on said regrowth mask residual layer and said gate.

9. The transistor device of claim 8, further comprising a field plate disposed over said spacer layer.

10. The transistor device of claim 1, wherein said regrowth mask residual layer comprises aluminum nitride (AlN).

11. The transistor device of claim 1, said regrowth structures comprising highly-doped aluminum gallium nitride (n+ AlGaN).

12. The transistor device of claim 1, said regrowth structures comprising highly-doped indium gallium nitride (n+ InGaN).

13. The transistor device of claim 1, said regrowth structures comprising a highly-doped combination of gallium nitride and aluminum gallium nitride (n+ GaN/AlGaN).

14. The transistor device of claim 1, said regrowth structures comprising a highly-doped combination of gallium nitride and indium gallium nitride (n+ GaN/InGaN).

15. A gallium nitride high electron mobility transistor (GaN HEMT) device, comprising:
a plurality of semiconductor layers;
a regrowth mask residual layer covering at least a portion of said plurality of semiconductor layers;
a gate on said regrowth mask residual layer and contacting said plurality of semiconductor layers through a gate trench in said regrowth mask residual layer;
a plurality of regrowth structures disposed on said plurality of semiconductor layers, said regrowth structures on different portions of said plurality of semiconductor layers than the portion covered by said regrowth mask residual layer, wherein a top surface of each of said regrowth structures is below a top surface of said plurality of semiconductor layers;
a source contact such that one of said regrowth structures is interposed between said source contact and said plurality of semiconductor layers; and
a drain contact such that one of said regrowth structures is interposed between said drain contact and said plurality of semiconductor layers.

16. The HEMT of claim 15, further comprising:
a spacer layer on said plurality of semiconductor layers; and
a field plate on said spacer layer at least partially between said source contact and said drain contact.

17. The GaN HEMT of claim 15, wherein said regrowth mask residual layer comprises aluminum nitride (AlN).

18. The GaN HEMT of claim 15, wherein said regrowth mask residual layer functions as a passivation layer.

19. The GaN HEMT of claim 15, wherein said plurality of regrowth structures comprises highly-doped gallium nitride (n+ GaN).

20. The GaN HEMT of claim 15, wherein said plurality of regrowth structures comprises highly-doped aluminum gallium nitride (n+ AlGaN).

21. The GaN HEMT of claim 15, wherein said plurality of regrowth structures comprises highly-doped indium gallium nitride (n+ InGaN).

22. The GaN HEMT of claim 15, wherein said regrowth structures contact said source and drain contacts such that an ohmic contact having a non-annealed morphology or a morphology consistent with low-temperature annealing is formed.

23. The GaN HEMT of claim 15, said regrowth structures comprising a highly-doped combination of gallium nitride and aluminum gallium nitride (n+ GaN/AlGaN).

24. The GaN HEMT of claim 15, said regrowth structures comprising a highly-doped combination of gallium nitride and indium gallium nitride (n+ GaN/InGaN).

25. A transistor device comprising:
at least one semiconductor layer;
a regrowth mask residual layer on at least a portion of said at least one semiconductor layer;
at least two regrowth structures comprising a highly doped semiconductor material, said regrowth structures adjacent said at least one semiconductor layer, such that said regrowth structures are adjacent to different portions of said at least one semiconductor layer than the portion covered by said regrowth mask residual layer, wherein a top surface of each of said regrowth structures is below a top surface of said at least one semiconductor layer;
a drain contact and a source contact, each on a different one of said at least two regrowth structures; and
a gate on said regrowth mask residual layer and within a gate trench of said regrowth mask residual layer.

26. The transistor device of claim 25, wherein said at least one semiconductor layer comprises gallium nitride (GaN).

27. The transistor device of claim 25, wherein said at least two regrowth structures comprises highly doped gallium nitride (n+GaN).

28. The transistor device of claim 25, wherein said at least two regrowth structures contact said source and drain contacts such that an ohmic contact having a non-annealed morphology or a morphology consistent with low-temperature annealing is formed.

29. The transistor device of claim 25, said at least one semiconductor layer comprising a barrier layer on said regrowth mask residual layer.

30. The transistor device of claim 25, further comprising a spacer layer on said regrowth mask residual layer and said gate.

31. The transistor device of claim 30, further comprising a field plate on said spacer layer.

32. The transistor device of claim 25, wherein said regrowth mask residual layer comprises aluminum nitride (ALN).

33. The transistor device of claim 25, said at least two regrowth structures comprising highly-doped aluminum gallium nitride (n+ AlGaN).

34. The transistor device of claim 25, said at least two regrowth structures comprising highly-doped indium gallium nitride (n+ InGaN).

35. The transistor device of claim 25, said at least two regrowth structures comprising a highly-doped combination of gallium nitride and aluminum gallium nitride (n$^{30}$ GaN/AlGaN).

36. The transistor device of claim 25, said at least two regrowth structures comprising a highly-doped combination of gallium nitride and indium gallium nitride (n$^{30}$ GaN/InGaN).

37. A transistor precursor structure, comprising:
at least one semiconductor layer;
a regrowth mask residual layer on a portion of said at least one semiconductor layer, said regrowth mask residual layer shaped to define a gate trench for deposition of a gate material, wherein a surface of said at least one semiconductor layer is exposed through said gate trench; and
a plurality of regrowth structures on said at least one semiconductor layer, said regrowth structures comprising exposed surfaces for deposition of drain and source contacts, said plurality of regrowth structures disposed on different portions of said at least one semiconductor layer than the portion covered by said regrowth mask residual layer, wherein a top surface of each of said regrowth structures is below a top surface of said at least one semiconductor layer.

* * * * *

UNITED STATES PATENT AND TRADEMARK OFFICE
CERTIFICATE OF CORRECTION

PATENT NO. : 8,878,245 B2  
APPLICATION NO. : 11/904064  
DATED : November 4, 2014  
INVENTOR(S) : Primit Parikh et al.

Page 1 of 1

It is certified that error appears in the above-identified patent and that said Letters Patent is hereby corrected as shown below:

In the Claims,

Column 7, Line 21, after "a plurality of regrowth structures" please delete "disposed"

Signed and Sealed this  
Fifth Day of May, 2015

Michelle K. Lee  
*Director of the United States Patent and Trademark Office*